(12) United States Patent
 Choi

(10) Patent No.: US 10,814,613 B2
(45) Date of Patent: Oct. 27, 2020

(54) PRINT SCREEN UNIT

(71) Applicant: VONTRONICS CO., LTD., Anyang-si (KR)

(72) Inventor: Soon-Von Choi, Gunpo-si (KR)

(73) Assignee: VONTRONICS CO., LTD., Anyang-si (KR)

( * ) Notice: Subject to any disclaimer, the term of this patent is extended or adjusted under 35 U.S.C. 154(b) by 141 days.

(21) Appl. No.: 16/084,576

(22) PCT Filed: Dec. 23, 2016

(86) PCT No.: PCT/KR2016/015218
§ 371 (c)(1),
(2) Date: Sep. 13, 2018

(87) PCT Pub. No.: WO2017/164493
PCT Pub. Date: Sep. 28, 2017

(65) Prior Publication Data
US 2019/0077142 A1 Mar. 14, 2019

(30) Foreign Application Priority Data
Mar. 24, 2016 (KR) .......................... 10-2016-0035292

(51) Int. Cl.
*B41F 15/34* (2006.01)
*B41F 15/08* (2006.01)
(Continued)

(52) U.S. Cl.
CPC .............. *B41F 15/36* (2013.01); *B41F 15/08* (2013.01); *B41F 15/14* (2013.01); *B41F 15/34* (2013.01);
(Continued)

(58) Field of Classification Search
CPC ...... B41F 15/36; B41F 15/08; B41F 15/0813; B41F 15/14; B41F 15/0845; B41F 15/34; B41M 1/12; B41N 1/248; H05K 3/1225
(Continued)

(56) References Cited

U.S. PATENT DOCUMENTS

| 4,041,861 A * | 8/1977 | Alter ...................... B41F 15/36 |
| | | 101/128.4 |
| 6,038,969 A | 3/2000 | Podlipec et al. |
| 2014/0290510 A1* | 10/2014 | Rawlings ................ B41F 15/36 |
| | | 101/128.1 |

FOREIGN PATENT DOCUMENTS

| JP | 2004262216 A | 9/2004 |
| JP | 2005524551 A | 8/2005 |
| (Continued) | | |

OTHER PUBLICATIONS

Office Action from Japan Patent Office of 2019-500195, dated Sep. 26, 2019.
(Continued)

*Primary Examiner* — Leslie J Evanisko
(74) *Attorney, Agent, or Firm* — STIP Law Group, LLC

(57) ABSTRACT

Disclosed herein is a print screen unit. The print screen unit has a structure in which the connection member is positioned to be slanted at a predetermined angle when the print screen is fitted to an interface unit, such that, as tensile force is applied to the print screen, the engagement state of engaging apertures of the print screen and engaging protrusions of the connection member moves toward the coupling direction thereof so as to further increase coupling force therebetween. And the print screen unit has a structure in which, when each of corner pieces is fitted into and connected to each of end portions of the interface unit, a connection surface area increases so as to bring three sur-
(Continued)

faces of the inside of the interface unit into close contact with a first and a second piece member.

3 Claims, 6 Drawing Sheets

(51) Int. Cl.
    *B41F 15/36*     (2006.01)
    *H05K 3/12*     (2006.01)
    *B41F 15/14*     (2006.01)
    *B41M 1/12*     (2006.01)
    *B41N 1/24*     (2006.01)

(52) U.S. Cl.
    CPC ............... *B41M 1/12* (2013.01); *B41N 1/248* (2013.01); *H05K 3/1225* (2013.01)

(58) Field of Classification Search
    USPC .................................. 101/127, 127.1, 128.1
    See application file for complete search history.

(56) References Cited

FOREIGN PATENT DOCUMENTS

| | | |
|---|---|---|
| JP | 2015131388 A | 7/2015 |
| KR | 1020040008353 A | 1/2004 |
| KR | 101102777 B1 | 1/2012 |
| KR | 101445271 B1 | 9/2014 |
| KR | 1020160012304 A | 2/2016 |
| WO | WO02055304 A1 | 7/2002 |
| WO | WO03093012 A1 | 11/2003 |
| WO | WO2007091035 A1 | 8/2007 |

OTHER PUBLICATIONS

European Search Report of EP 16 89 5619, dated Jan. 8, 2019, English translation.
International Search Report of PCT/KR2016/015218, dated Apr. 4, 2017, English Translation.

* cited by examiner

PRINT SCREEN UNIT

CROSS-REFERENCE TO RELATED APPLICATIONS

This application is the U.S. National Phase under 35 U.S.C. § 371 of International Application No. PCT/KR2016/015218 filed on Dec. 23, 2016, which in turn claims the benefit of Korean Application No. 10-2016-0035292, filed on Mar. 24, 2016, the disclosures of which are incorporated by reference into the present application.

TECHNICAL FIELD

The present invention relates generally to a print screen unit and, more particularly, to a print screen unit, wherein a structure by which a print screen is connected to a support frame is simplified so as to reduce manufacturing costs, and when a tensile force is applied to the print screen by a tension apparatus attached thereto, a coupling force between the print screen and the support frame further increases, which enables an even tensile force to be applied to the print screen without creasing the print screen.

BACKGROUND ART

Generally, a print screen is made of thin and stiff metallic materials, and typically, is made of stainless steel or brass, and usually has multiple printing apertures forming patterns used in printing via printing mediums such as solder. The print screen, a flexible punched sheet made of mesh interwoven with polypropylene or stainless steel strand, is attached to a rectangular support frame so as to tension the print screen.

Though the print screen is used while being mounted to the support frame, the print screen is deformed by a squeegee when there is a loosened part on the print screen, and thus the position of a printing pattern is deviated or the printing pattern is deformed. To prevent this in performing screen printing, a predetermined amount of tensile force is continuously applied to the print screen so as to maintain the tension of the print screen.

Since the print screen often adheres to the support frame by use of an adhesive, the print screen is already attached to the support frame when the print screen is required. Accordingly, when the print screen is not used, it is required to keep or carry the print screen attached to the support frame, which is heavy and large.

There is a support frame configured in such a manner that a print screen is attached to the support frame by winding or clamping edges of the print screen. As for the support frame, though when the print screen is not used, the print screen may be removed from the support frame to be kept or carried, the print screen is thin and thus it is difficult to keep or carry the without damaging printing patterns formed precisely thereon.

In consideration of this problem, as shown FIGS. 1 to 3, a conventional print screen unit 10 disclosed in Korean Patent No. 10-0110277 includes a print screen 12, which has a rectangular shape, including a pattern of printing apertures 20 provided by laser cutting or etching so as to form a pattern of printed deposits, and a support frame 14 including a first and a second pair of interface units 16, 16, 17, 17 attached to each pair of opposing edges of the print screen 12, and a first to a fourth corner piece 18a-18d which connect each of the interface units 16, 16, 17, 17 to each other.

The print screen 12, to which a tension apparatus (not shown) is attached, includes a plurality of protrusions 22 provided on each of the edges thereof along a longitudinal direction of the edge, each of the protrusions having a castellated structure and being spaced apart from each other, and the protrusions being bent so as to constitute adhesive materials 24.

The protrusions 22 are bent along each of the edges of the print screen 12, and the protrusions 22 constitute each of the adhesive materials 24 functioning as a hook, which covers sharp angles of the print screen unit 10.

The interface unit 16, 16, 17, 17 includes an attach slot 32 extending along a longitudinal direction thereof, and an adhesion part 26 in which each of the adhesive materials 24 of the print screen 12 is positioned.

However, as for the conventional print screen unit 10 having a configuration mentioned above, the print screen 12 is configured in such a manner that the protrusions 22 are normally provided on the edge of the print screen by cutting and bending, and accordingly, when the protrusions 22 of the print screen 12 are fitted into and connected to each of the interface units 16, 16, 17, 17, an additional connection member is not required. However, since the protrusions 22 acting as a connection member are manufactured through a first cutting and a second bending, manufacturing the print screen 12 takes much time and cost, and when fitting the print screen into the interface unit, a worker may be harmed by the sharp edges of the print screen 12.

Additionally, since the print screen unit is configured in such a manner that with the protrusions 22 of the print screen 12 bent, the protrusions are correspondingly fitted into the attach slot 32 of the interface unit 16, 16, 17, 17, when giving tension to the print screen 12 by applying the tensile force to the interface unit 16, 16, 17, 17, the protrusions 22 do not stand the tensile force, and the bent shapes are deformed or damaged, which causes the protrusions to break away from the attach slot 32.

Meanwhile, as shown FIGS. 4 to 6, another conventional print screen unit 110 disclosed in Korean Patent No. 10-1445271 includes a print screen 112, which has a rectangular shape, including a pattern of printing apertures 120, and a support frame 114 including a first and a second pair of interface units 116, 116, 117, 117 attached to each pair of opposing edges of the print screen 112, and a first to a fourth corner piece 118a-118d which connect each of the interface units 116, 116, 117, 117 to each other.

The print screen 112 to which a tension apparatus (not shown) is attached includes a plurality of engaging apertures 124a, 124b provided on each of the edges of the print screen along longitudinal directions thereof such that the print screen is engaged with each of connection members 130 so as to be fitted into the interface unit 116, 116, 117, 117.

The first to fourth corner piece 118a-118d include a first and a second connection member 166, 170 provided by protruding therefrom in directions orthogonal to each other such that each of the first to fourth corner piece is fitted into concave parts 156 of each of end portions of the interface units 116, 116, 117, 117 neighboring the first to fourth corner piece.

The connection member 130 includes a long body 157, which is a long rectangular shape bar, provided so as to be fitted into a support slot part 144 of a connection slot 142 in each of the interface unit 116, 116, 117, 117, and first and second row engaging protrusions 158a, 158b provided on the long body in longitudinal directions thereof, the first and second row engaging protrusions having protruding engaging structures, which have shapes of protruding studs, so as to be engaged with the first and second row engaging apertures 124*a*, 124*b* of each edge of the print screen 112.

The interface unit 116, 116, 117, 117 includes the concave parts 156 provided on each of end portions thereof so as to house the first and second protruding connection member 166, 170 of each of the corner pieces 118*a*-118*d*.

The connection slot 142 includes a flat support part, and the support slot part 144 supporting at least one connection member 130 and having an engaging surface 146 provided on an edge of an inside of the connection slot, and when a tensile force is applied to the interface unit 116, 116, 117, 117 against the connection slot, at least one connection member 130 is fitted into the connection slot.

The connection slot 142 further includes a second slot part 148 having at least one concave part 150 provided by a first and a second parallel slot 150*a*, 150*b* corresponding to the first and second row engaging apertures 124*a*, 124*b* on each edge of the print screen 112.

However, as for the conventional print screen unit 110 having a configuration mentioned above, since the print screen 112 is configured in such a manner that while the first and the second row engaging apertures 124*a*, 124*b* of each edge of the print screen are correspondingly engaged with the first and second row engaging protrusions 158*a*, 158*b* provided on the connection member 130, the connection member 130 is fitted into the support slot part 144 of each of the interface units 116, 116, 117, 117, the edge of the print screen 112 may be prevented from being damaged or deformed by a tensile force applied to the print screen, but the connection member 130 is provided in such a manner that an upper layer long body 157 which has the first and second row engaging protrusions 158*a*, 158*b* and a lower layer long body 157 which does not have the first and second row engaging protrusions 158*a*, 158*b* are manufactured separately and then come into surface contact with each other so as to be integrated with each other, thereby making the mass production of the connection member difficult and materials wasted, and causing much manufacturing costs and time, and accordingly, increasing production costs.

Furthermore, when the connection member 130, which is lying and engaged with the edge of the print screen 112, is fitted into the support slot part 144 of the interface unit 116, 116, 117, 117, a thickness surface side of the connection member 130 is in contact with the engaging surface 146 of the support slot part 144 with a small difference in height therebetween, and simultaneously, the connection member is arranged to be orthogonal to the direction of the tensile force. Accordingly, when tensioning the print screen 112 by applying the tensile force to the interface unit 116, 116, 117, 117, gaps grow on a part on which the edge of the print screen 112 is engaged with the connection member 130, decreasing a coupling force between the edge of the print screen and the connection member and shortening the life of the print screen unit.

In addition, since the first and the second connection members 166, 170 protruding from each of the first to fourth corner piece 118*a*-118*d* in directions orthogonal to each other are configured to have thin plates so as to be correspondingly fitted only into the concave parts 156 of each of the end portions of the interface units 116, 116, 117, 117 neighboring the first and the second connection member, each of the first and the second connection members is not in contact with an engaging surface 154 of the tension apparatus, the engaging surface 154 being provided under the concave parts 156, thereby causing a considerable gap between the end portion of the interface unit 116, 116, 117, 117 and the corner piece 118*a*-118*d* and horizontal and vertical shaking, which lowers a coupling force therebetween considerably.

DISCLOSURE

Technical Problem

Accordingly, the present invention has been made keeping in mind the above problems occurring in the prior art, and an object of the present invention is to provide a print screen unit, wherein the mass-production of the connection member is enabled so as to minimize the loss of materials and decrease manufacturing costs and time, which lowers production costs.

Another object of the present invention is to provide a print screen unit, wherein as a tensile force is applied to a print screen, the engagement state of the edges of the print screen and the connection member moves toward the coupling direction thereof so as to further increase coupling force therebetween.

Still another object of the present invention is to provide a print screen unit, wherein when the end portions of the interface unit are connected to the corner pieces, gaps therebetween are minimized, and the end portions of the interface unit are firmly coupled to the corner pieces so as to prevent horizontal and vertical shaking.

Technical Solution

In order to accomplish the above object, according to an embodiment of the present invention, there is provided a print screen unit, including: a print screen, which has a rectangular shape, including a pattern of printing apertures, and a support frame including a first and a second pair of interface units to which the print screen is fitted and attached by a connection member engaged correspondingly with each pair of edges of the print screen, and a first to a fourth corner piece which connect each of the interface units to each other, wherein the print screen and the connection member include engaging apertures provided on the edge of the print screen and engaging protrusions provided on a lower part of the connection member respectively, which have rectangular shapes, at predetermined intervals along longitudinal directions thereof such that the edge of the print screen is fitted into the interface unit by the engaging apertures and the engaging protrusions being correspondingly engaged with each other, wherein the interface unit is provided with a lower side body part including a first connection slot to which each edge of the print screen is horizontally fitted, and provided with an upper side body part including a second connection slot to which the connection member standing vertically is fitted.

In an embodiment, an end of the lower side body part of the present invention may be configured in such a manner that without blocking a lower side opening of the second connection slot, the end of the lower side body part does not interfere with the connection member when the connection member is fitted into the second connection slot.

In an embodiment, the second connection slot of the present invention may be configured to be slanted at an angle of 7~15° in a direction in which tension is applied to the interface unit as the connection member moves from an upper part of the second connection slot to a lower part thereof when the connection member standing vertically is fitted into the second connection slot.

In an embodiment, each of the corner pieces of the present invention may be provided with a first and a second piece member connected orthogonally to each other such that the first and the second piece member are correspondingly and simultaneously fitted into concave parts of each of end portions of the interface units and an engaging surface.

In an embodiment, the first piece member of the present invention may include: a body, which has a rectangular shape, positioned at a corner at which the end portions of the interface units are orthogonal to each other; a slot provided on a first side surface of the body in a first direction thereof such that the second piece member passes through the first side surface of the body and is correspondingly fitted into and connected to the concave parts of the end portion of the interface unit; and a protruding part provided on a second side surface of the body by protruding therefrom in a second direction orthogonal to the first direction of the slot such that the protruding part is correspondingly fitted into the concave parts of the end portion of the interface unit, wherein the protruding part of the first piece member and the second piece member include engaging surfaces provided on middle parts of one side flat surfaces of the protruding part and the second piece member respectively by protruding along longitudinal directions thereof such that each of the engaging surfaces is correspondingly engaged with the engaging surface of the end portion of the interface unit, and the slot of the first piece member includes an engaging surface, which has a concave shape, provided on one inside flat surface of the slot such that the engaging surface is correspondingly engaged with the engaging surface of the second piece member. In an embodiment, the second piece member of the present invention may include a stop jaw provided on one side end thereof such that when the second piece member is fitted into the slot so that the first and the second piece member are orthogonal to each other, the second piece member is fitted into an area corresponding to an end portion of the slot while stopping by being in contact with a side surface of the engaging surface of the slot.

Advantageous Effects

As described above, the print screen unit of the present invention can minimize the loss of the materials and, simultaneously, reduce manufacturing costs and time so as to lower production costs since the upper side long body and the lower side engaging protrusions of the connection member are cut at the same time by pressing and can be continuously mass-produced.

The print screen unit of the present invention has a structure in which the connection member is positioned to be slanted at a predetermined angle when the print screen is fitted to the interface unit after the engaging apertures of each edge of the print screen are caught on the engaging protrusions of the connection member, such that, as tensile force is applied to the print screen, the engagement state of the engaging apertures of the print screen and the engaging protrusions of the connection member moves toward the coupling direction thereof so as to further increase coupling force therebetween.

The print screen unit of the present invention has a structure in which, when each of the corner pieces is fitted into and connected to each of end portions of the interface unit, a connection surface area increases so as to bring the three surfaces of the inside of the interface unit into close contact with the first and second piece member, thereby enabling a gap between the end portion of the interface unit and the corner piece to be minimized and, simultaneously, enabling the end portion of the interface and the corner piece to be firmly coupled to each other such that horizontal and vertical shaking is prevented.

Figure 1:
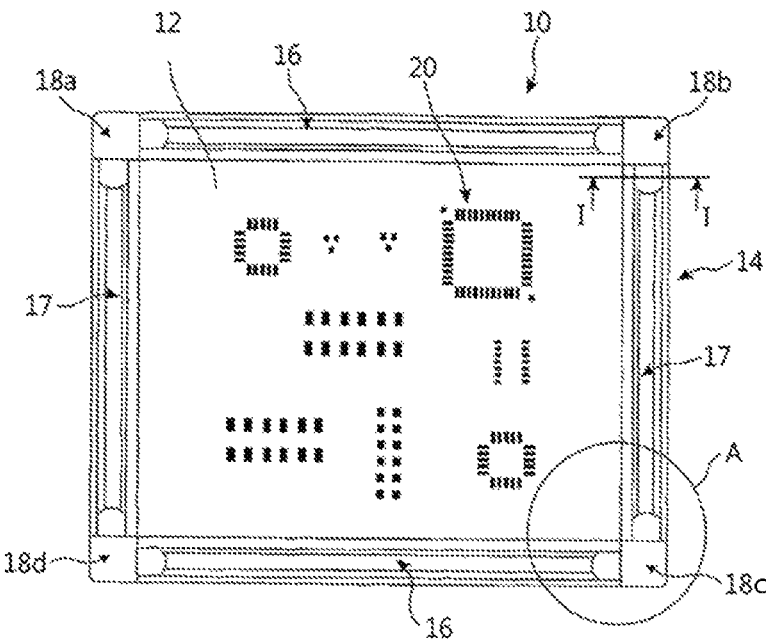
FIG. 1 is a top plan view showing a conventional print screen unit.
Figure 2:
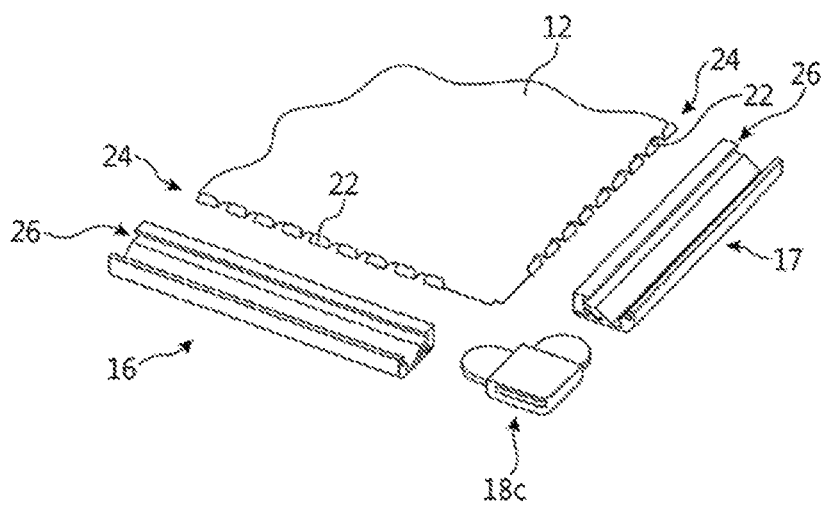
FIG. 2 is an exploded perspective view showing an A area of FIG. 1.
Figure 3:
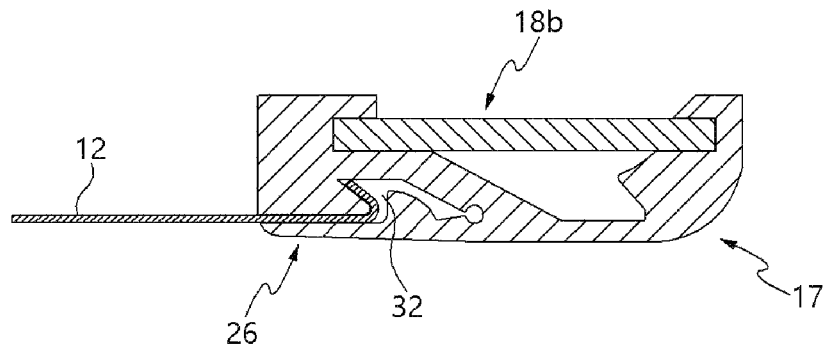
FIG. 3 is a cross-sectional view taken along line I-I of FIG. 1.
Figure 4:
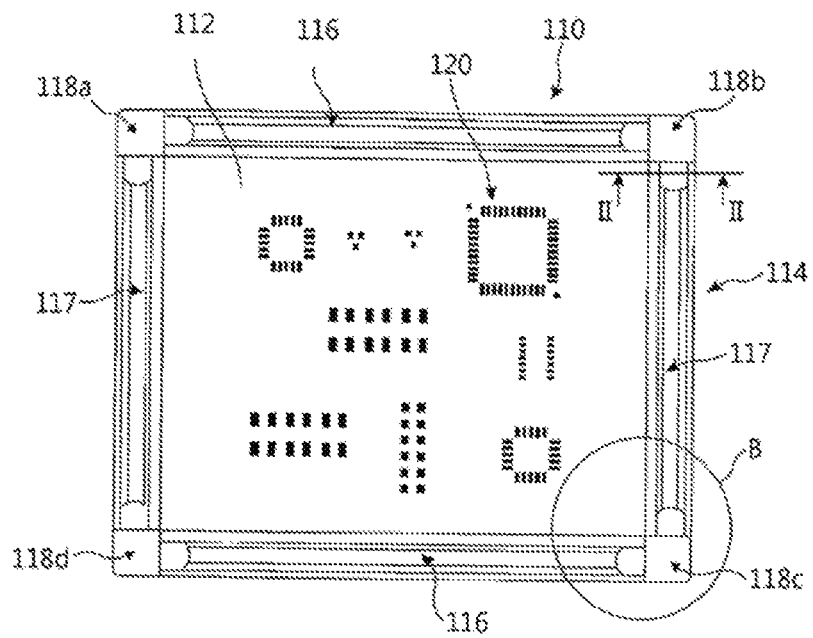
FIG. 4 is a top plan view showing another conventional print screen unit.
Figure 5:
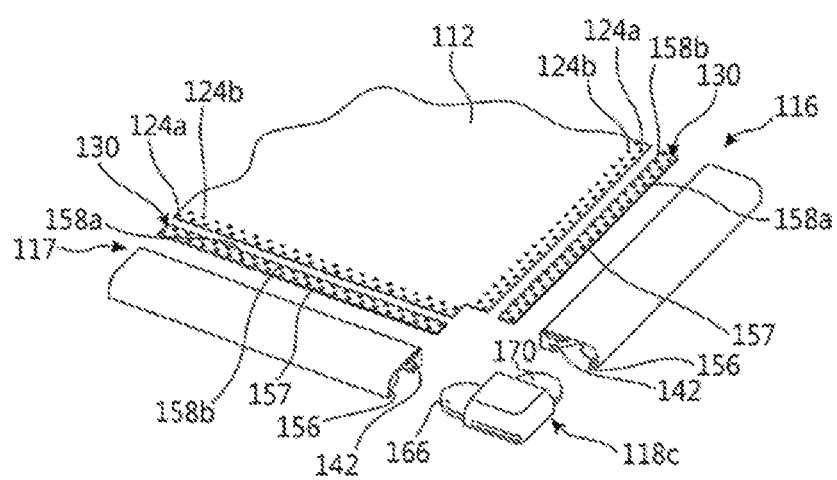
FIG. 5 is an exploded perspective view showing a B area of FIG. 4.
Figure 6:
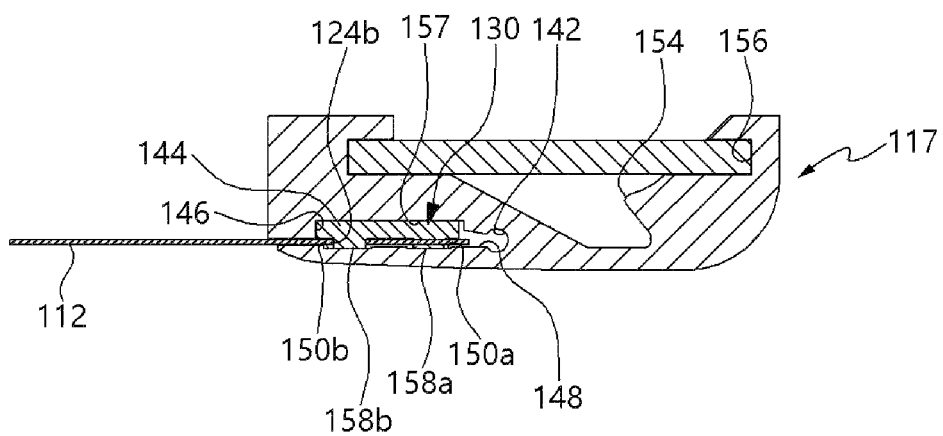
FIG. 6 is a cross-sectional view taken along line II-II of FIG. 4.
Figure 7:
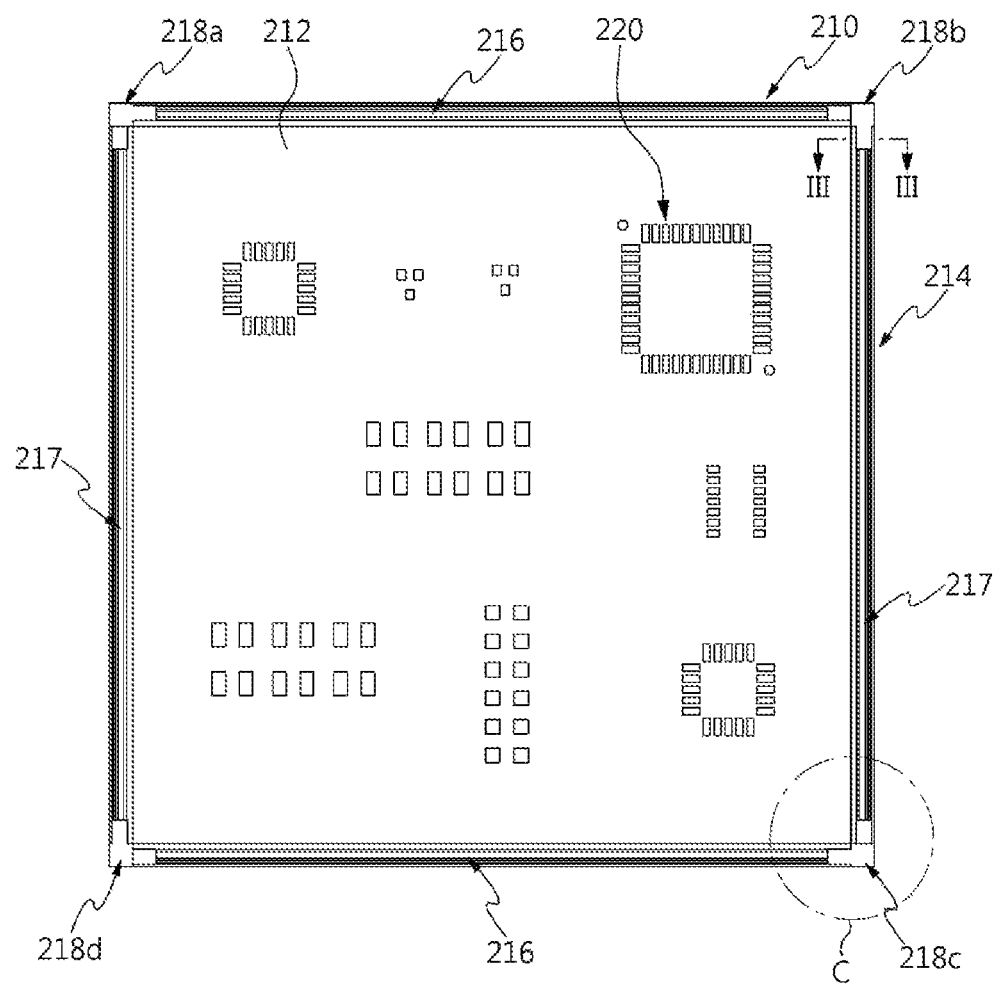
FIG. 7 is a top plan view showing a print screen unit of the present invention.
Figure 8:
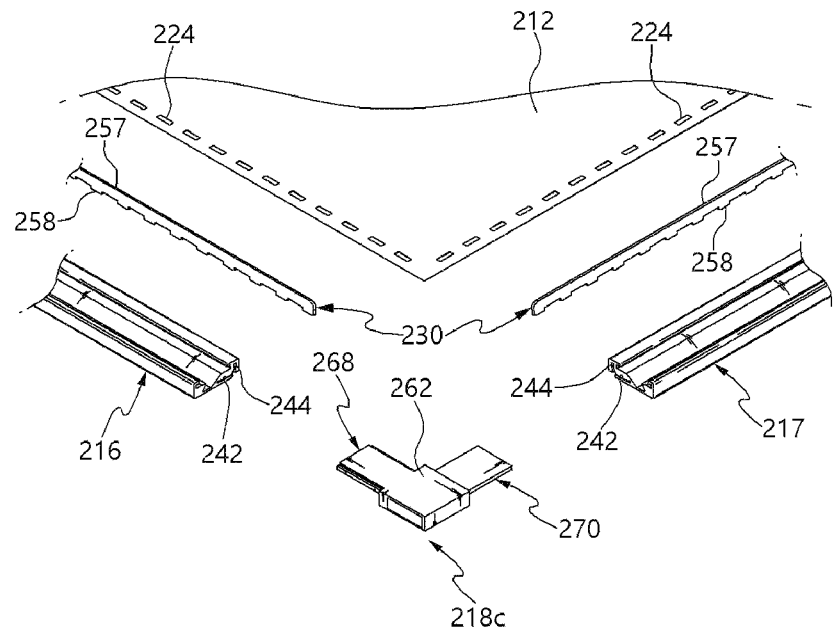
FIG. 8 is an exploded perspective view showing a C area of FIG. 7.

| * Description of the Reference Numerals in the Drawings* | |
|---|---|
| 210: Print screen unit | 212: Print screen |
| 214: Support frame | 216: First interface unit |
| 217: Second interface unit | 218a-218d: First to fourth corner piece |
| 220: Printing aperture | 224: Engaging aperture |
| 230: Connection member | 238: Lower side body part |
| 240: Upper side body part | 242: First connection slot |
| 244: Second connection slot | 254: Engaging surface |
| 256: Concave parts | 257: Long body |
| 258: Engaging protrusion | 262: Body |
| 264: Slot | 264a: Engaging surface |
| 266: Protruding part | 266a: Engaging surface |
| 268: First piece member | 270: Second piece member |
| 270a: Engaging surface | 270b: Stop jaw |

MODE FOR INVENTION

Hereinafter, an embodiment of the present invention will be described in detail with reference to FIGS. 7 to 10.

A print screen unit 210 of the present invention includes: a print screen 212, which has a rectangular shape, including a pattern of printing apertures 220, and a support frame 214 including a first and a second pair of interface units 216, 216, 217, 217 to which the print screen is fitted and attached by a connection member 230 engaged correspondingly with each pair of edges of the print screen 212, and a first to a fourth corner piece 218a-218d which connect each of the interface units 216, 216, 217, 217 to each other.

The print screen 212 includes engaging apertures 224 provided on the edge thereof at a predetermined interval along a longitudinal direction thereof such that the edge of the print screen is engaged with a lower part of the connection member 230 so as to correspond to the lower part thereof and is fitted into the interface unit 216, 216, 217, 217.

The interface unit 216, 216, 217, 217 is provided with a lower side body part 238 including a first connection slot 242 to which each edge of the print screen 212 is horizontally fitted, and provided with an upper side body part 240 including a second connection slot 244 to which the connection member 230 standing vertically is fitted.

An end of the lower side body part 238 is configured in such a manner that without blocking a lower side opening of the second connection slot 244, the end of the lower side body part does not interfere with the connection member when the connection member 230 is fitted into the second connection slot 244.

The second connection slot 244 is configured to be slanted at an angle of 7~15° in a direction in which tension is applied to the interface unit 216, 216, 217, 217 as the connection member 230 moves from an upper part of the second connection slot to a lower part thereof when the connection member 230 standing vertically is fitted into the second connection slot.

The upper side body part 240 includes an engaging surface 254 provided on an inside lower end thereof by extending along a longitudinal direction of the interface unit 216, 216, 217, 217 so as to give engagement to a tension apparatus (not shown), and concave parts 256 provided on opposite ends of an inside upper end thereof by extending along longitudinal directions of the interface unit 216, 216, 217, 217 so as to house both end parts of each of the corner pieces 218a-218d, the both end parts being orthogonal to each other.

The connection member 230, which is a long rectangular shape bar, includes a long body 257 provided such that the long body is fitted into the second connection slot 244 by standing vertically in the second connection slot provided in the upper side body part 240 of the interface unit 216, 216, 217, 217, and engaging protrusions 258 provided on a lower part of the long body 257 at predetermined intervals in series along a longitudinal direction thereof such that the engaging protrusions are correspondingly engaged with the engaging apertures 224.

The corner piece 218a-218d is provided with a first and a second piece member 268, 270 connected orthogonally to each other such that the first and the second piece member are simultaneously fitted correspondingly into concave parts 256 of each of end portions of the interface units 216, 216, 217, 217 and the engaging surface 254.

The first piece member 268 includes: a body 262, which has a rectangular shape, positioned at a corner at which the end portions of the interface units 216, 216, 217, 217 are orthogonal to each other; a slot 264 provided on a first side surface of the body 262 in a first direction thereof such that the second piece member 270 passes through the first side surface of the body 262 and is correspondingly fitted into and connected to the concave parts 256 of the end portion of the interface unit 216, 216, 217, 217; and a protruding part 266 provided on a second side surface of the body 262 by protruding therefrom in a second direction orthogonal to the first direction of the slot 264 such that the protruding part is correspondingly fitted into the concave parts 256 of the end portion of the interface unit 216, 216, 217, 217.

The protruding part 266 of the first piece member 268 and the second piece member 270 include engaging surfaces 266a, 270a provided on middle parts of one side flat surfaces of the protruding part and the second piece member respectively by protruding along longitudinal directions thereof such that each of the engaging surfaces 266a, 270a is correspondingly fitted into the engaging surface 254 of the end portion of the interface unit 216, 216, 217, 217, and the slot 264 of the first piece member 268 includes an engaging surface 264a, which has a concave shape, provided on one inside flat surface of the slot such that the engaging surface 264a is correspondingly engaged with the engaging surface 270a of the second piece member 270, and the second piece member 270 includes a stop jaw 270b provided on one side end thereof such that when the second piece member is fitted into the slot so that the first and the second piece member 268, 270 are orthogonal to each other, the second piece member is fitted into an area corresponding to an end portion of the slot 264 while stopping by being in contact with a side surface of the engaging surface 264a of the slot 264.

Next, the operation and effect of the print screen unit of the present invention having a configuration mentioned above will be described.

To assemble the print screen unit 210 of the present invention, when the support frame 214 is fitted over the print screen 212, each of the interface units 216, 216, 217, 217 is fitted over each edge of the print screen 212, and the end portions of the interface units 216, 216, 217, 217 are connected to each other by the corner pieces 218a-218d.

In addition, when the interface unit 216, 216, 217, 217 is fitted over the print screen 212, while the engaging protrusions 258 provided on the lower part of the connection member 230 are inserted into the engaging apertures 224 of the print screen 212 so as to be engaged with the engaging apertures 224, an upper side long body 257 of the connection member 230 is fitted into the second connection slot 244 provided in the upper side body part 240 of the interface unit 216, 216, 217, 217, and each of the edges of the print screen 212 is fitted into the first connection slot 242 provided in the lower side body part 238 of the interface unit 216, 216, 217, 217.

Figure 9:
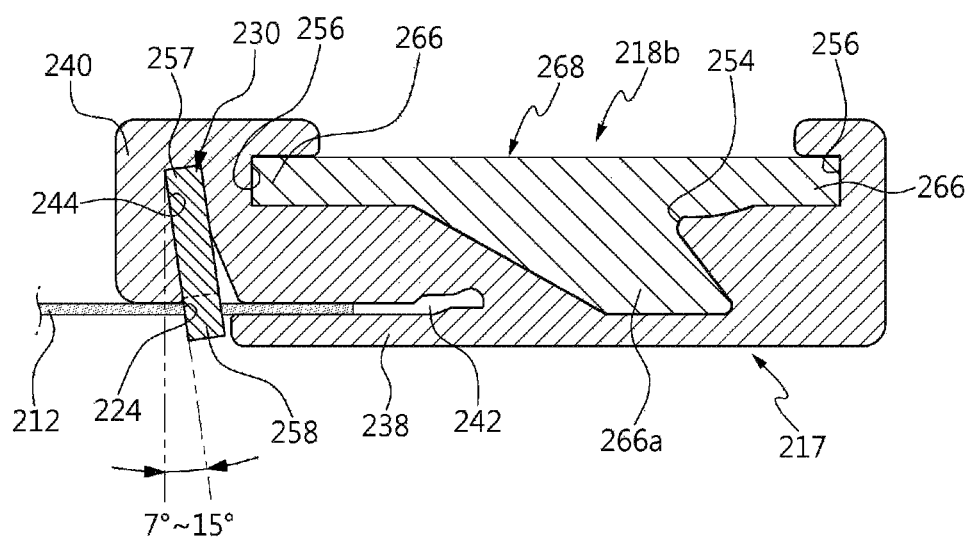
FIG. 9 is a cross-sectional view taken along line III-III of FIG. 7.
Figure 10:
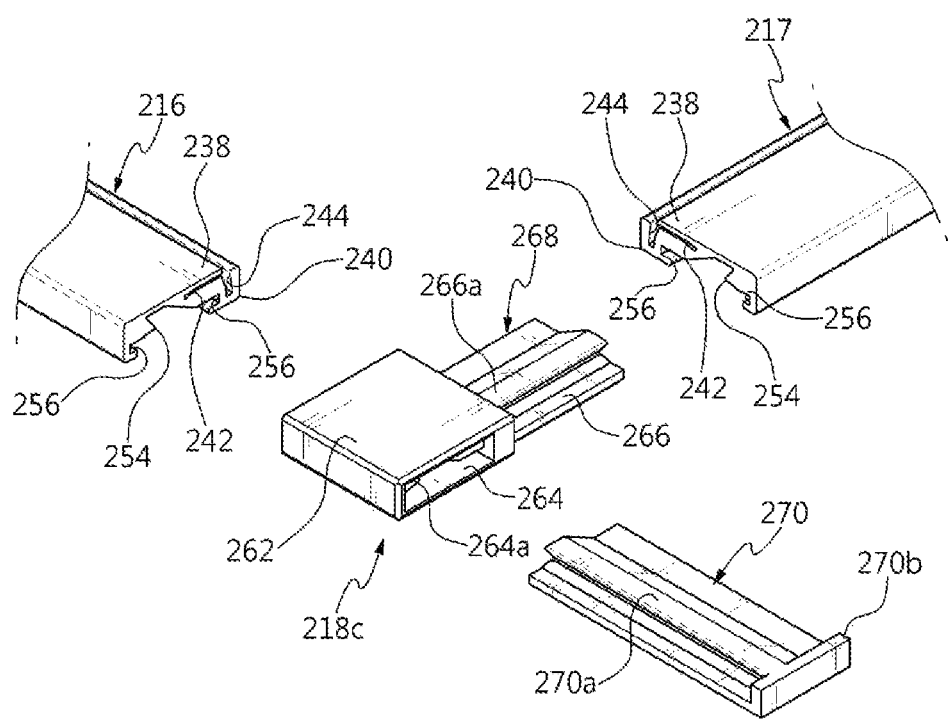
FIG. 10 is an exploded perspective view showing interface components and a corner piece turned upside down of the present invention.

In this case, as shown in FIG. 9, the interface unit is configured in such a manner that the connection member is fitted into the second connection slot 244 slanting at an angle of 7~15° such that with the connection member 230 standing vertically, the upper side long body 257 is positioned in a direction opposite to a direction to which a tensile force is applied, and the lower side engaging protrusions 258 are positioned in a direction to which the tensile force is applied. Accordingly, when the tensile force is applied to the interface unit 216, 216, 217, 217 so as to tension the print screen 212, the engaging apertures 224 of the print screen 212, which are loosely engaged with the engaging protrusions 258 of the connection member 230, slide over a slanting surface of the connection member 230, and reach uppermost ends of the engaging protrusions 258 so as to couple the print screen securely to the interface unit, thereby applying an even tensile force to the print screen 212, and further increasing a coupling force between the print screen and the interface unit so as to prevent the engaging apertures 224 from being disengaged from the engaging protrusions.

That is, since the print screen unit has a structure in which the connection member 230 is positioned to be slanted at an angle of 7~15° when the print screen is fitted into the interface unit 216, 216, 217, 217 after the engaging apertures 224 of each edge of the print screen 212 are caught on the engaging protrusions 258 of the connection member 230, as tensile force is applied to the print screen, the engagement state of the engaging apertures 224 of the print screen 212 and the engaging protrusions 258 of the connection member 230 moves toward the coupling direction thereof, and the print screen comes into close contact with a lower surface of the upper side body part 240 so as to further increase a coupling force therebetween.

In addition, since the upper side long body 257 and the lower side engaging protrusions 258 of the connection member 230 are cut at the same time by pressing and can be continuously mass-produced, the loss of the materials can be minimized, and manufacturing costs and time are reduced, which lowers production costs.

Furthermore, as shown in FIG. 9, the print screen unit is configured in such a manner that when the corner piece 218a-218d is fitted into and connected to each of the end portions of the interface unit 216, 216, 217, 217, the first and the second piece member 268, 270 of the corner piece 218a-218d are correspondingly fitted into the concave parts 256 of the end portion of the interface unit 216, 216, 217, 217 so as to bring secure connection therebetween on the opposite sides of the concave parts, and each of the engaging surfaces 266a, 270a provided on middle parts of one side flat surfaces of the first and the second piece member 268, 270 by protruding therefrom are correspondingly and securely engaged with the engaging surface 254 provided under the concave parts 256 of the interface unit 216, 216, 217, 217 so as to bring the three surfaces of the inside of the interface unit into close contact with the first and the second piece member, thereby increasing a connection surface area and minimizing a gap between the end portion of the interface unit 216, 216, 217, 217 and each of the corner pieces 218a-218d, and coupling the end portion of the interface and the corner piece firmly to each other so as to prevent horizontal and vertical shaking.

Meanwhile, although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A print screen unit, comprising:
a print screen, which has a rectangular shape, including a pattern of printing apertures, and
a support frame including a first and a second pair of interface units to which the print screen is fitted and attached by a connection member engaged correspondingly with each pair of edges of the print screen, and a first to a fourth corner piece which connect each of the interface units to each other,
wherein
the print screen includes engaging apertures provided on the edge of the print screen and the connection member includes engaging protrusions provided on a lower part of the connection member, the engaging protrusions having rectangular shapes, at predetermined intervals along longitudinal directions thereof such that the edge of the print screen is fitted into the interface unit by the engaging apertures and the engaging protrusions being correspondingly engaged with each other,
the interface unit is provided with a lower side body part including a first connection slot to which each edge of the print screen is horizontally fitted, and provided with an upper side body part including a second connection slot to which the connection member standing vertically is fitted,
each of the corner pieces is provided with a first and a second piece member connected orthogonally to each other such that the first and the second piece member are correspondingly and simultaneously fitted into concave parts of each of end portions of the interface units and an engaging surface,
the first piece member includes: a body, which has a rectangular shape, positioned at a corner at which the end portions of the interface units are orthogonal to each other; a slot provided on a first side surface of the body in a first direction thereof such that the second piece member passes through the first side surface of the body and is correspondingly fitted into and connected to the concave parts of the end portion of the interface unit; and a protruding part provided on a second side surface of the body by protruding therefrom in a second direction orthogonal to the first direction of the slot such that the protruding part is correspondingly fitted into the concave parts of the end portion of the interface unit,
the protruding part of the first piece member and the second piece member include engaging surfaces provided on middle parts of one side flat surfaces of the protruding part and the second piece member respectively by protruding along longitudinal directions thereof such that each of the engaging surfaces is correspondingly engaged with the engaging surface of the end portion of the interface unit, and the slot of the first piece member includes an engaging surface, which has a concave shape, provided on one inside flat surface of the slot such that the engaging surface is correspondingly engaged with the engaging surface of the second piece member, and
the second piece member includes a stop jaw provided on one side end thereof such that when the second piece member is fitted into the slot so that the first and the second piece member are orthogonal to each other, the second piece member is fitted into an area corresponding to an end portion of the slot while stopping by being in contact with a side surface of the engaging surface of the slot.

2. The print screen unit of claim 1, wherein an end of the lower side body part is configured in such a manner that without blocking a lower side opening of the second connection slot, the end of the lower side body part does not interfere with the connection member when the connection member is fitted into the second connection slot.

3. The print screen unit of claim 1, wherein the second connection slot is configured to be slanted at an angle of 7~15° in a direction in which tension is applied to the interface unit as the connection member moves from an upper part of the second connection slot to a lower part thereof when the connection member standing vertically is fitted into the second connection slot.

* * * * *